US007219314B1

(12) United States Patent
Trimberger et al.

(10) Patent No.: US 7,219,314 B1
(45) Date of Patent: May 15, 2007

(54) APPLICATION-SPECIFIC METHODS FOR TESTING MOLECTRONIC OR NANOSCALE DEVICES

(75) Inventors: Steven M. Trimberger, San Jose, CA (US); Shekhar Bapat, Cupertino, CA (US); Robert W. Wells, Cupertino, CA (US); Robert D. Patrie, Scotts Valley, CA (US); Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 330 days.

(21) Appl. No.: 10/815,483

(22) Filed: Apr. 1, 2004

Related U.S. Application Data

(63) Continuation-in-part of application No. 10/388,000, filed on Mar. 12, 2003, now Pat. No. 7,007,250, which is a continuation-in-part of application No. 10/104,324, filed on Mar. 22, 2002, now Pat. No. 6,817,006, which is a continuation-in-part of application No. 09/924,365, filed on Aug. 7, 2001, now Pat. No. 6,664,808.

(51) Int. Cl.
*G06F 17/50* (2006.01)
*G06F 11/07* (2006.01)
*G01R 31/3181* (2006.01)
*G01R 31/02* (2006.01)

(52) U.S. Cl. .............................. 716/4; 716/16; 716/18; 714/32; 714/33; 714/725; 714/742; 324/526; 324/537

(58) Field of Classification Search ................. 716/4, 716/16, 18; 714/32, 33, 725, 742; 324/528, 324/537
See application file for complete search history.

(56) References Cited

U.S. PATENT DOCUMENTS

| 3,995,261 | A | | 11/1976 | Goldberg |
| 4,020,469 | A | | 4/1977 | Manning |
| 4,700,187 | A | | 10/1987 | Furtek |
| 5,349,248 | A | * | 9/1994 | Parlour et al. ................ 326/38 |
| 5,459,342 | A | | 10/1995 | Nogami et al. |
| 5,498,975 | A | | 3/1996 | Cliff et al. |
| 5,498,979 | A | * | 3/1996 | Parlour et al. ................ 716/16 |

(Continued)

OTHER PUBLICATIONS

Howard et al., "The Yield Enhancement of Field-Programmable Gate Arrays", IEEE Transactions on Very Large Scale Integation (VLSI) Systems, vol. 2, No. 1, Mar. 1994, pp. 115-123.*

(Continued)

*Primary Examiner*—Phallaka Kik
(74) *Attorney, Agent, or Firm*—Arthur J. Behiel; LeRoy D. Maunu (57) ABSTRACT

Described are methods for implementing customer designs in programmable logic devices (PLDs). The defect tolerance of these methods makes them particularly useful with the adoption of "nanotechnology" and molecular-scale technology, or "molectronics." Test methods identify alternative physical interconnect resources for each net required in the user design and, as need, reroute certain signal paths using the alternative resources. The test methods additionally limit testing to required resources so devices are not rejected as a result of testing performed on unused resources. The tests limit functional testing of used resources to those functions required in the user designs.

17 Claims, 7 Drawing Sheets

U.S. PATENT DOCUMENTS

| | | | |
|---|---|---|---|
| 5,777,887 | A | 7/1998 | Marple et al. |
| 5,790,771 | A | 8/1998 | Culbertson et al. |
| 5,889,413 | A | 3/1999 | Bauer |
| 5,914,616 | A | 6/1999 | Young et al. |
| 6,075,418 | A | 6/2000 | Kingsley et al. |
| 6,128,214 | A | 10/2000 | Kuekes et al. |
| 6,166,559 | A | 12/2000 | McClintock et al. |
| 6,167,558 | A | 12/2000 | Trimberger |
| 6,215,327 | B1 | 4/2001 | Lyke |
| 6,232,845 | B1 | 5/2001 | Kingsley et al. |
| 6,237,131 | B1 * | 5/2001 | MacArthur et al. .......... 716/16 |
| 6,256,767 | B1 | 7/2001 | Kuekes et al. |
| 6,314,019 | B1 | 11/2001 | Kuekes et al. |
| 6,356,514 | B1 | 3/2002 | Wells et al. |
| 6,427,156 | B1 | 7/2002 | Chapman et al. |
| 6,432,740 | B1 | 8/2002 | Chen |
| 6,459,095 | B1 | 10/2002 | Heath et al. |
| 6,526,559 | B2 * | 2/2003 | Schiefele et al. ............ 716/16 |
| 6,532,579 | B2 * | 3/2003 | Sato et al. ..................... 716/8 |
| 6,651,225 | B1 | 11/2003 | Lin et al. |
| 6,651,238 | B1 | 11/2003 | Wells et al. |
| 6,664,808 | B2 | 12/2003 | Ling et al. |
| 6,732,348 | B1 * | 5/2004 | Tahoori et al. ............... 716/16 |
| 6,886,117 | B2 * | 4/2005 | Ku ............................. 714/711 |
| 6,891,395 | B2 * | 5/2005 | Wells et al. ................... 326/38 |
| 7,047,465 | B1 * | 5/2006 | Trimberger ................ 714/725 |
| 7,058,534 | B1 * | 6/2006 | Tracy et al. ................ 702/117 |
| 7,058,918 | B2 * | 6/2006 | Abramovici et al. .......... 716/12 |
| 7,111,213 | B1 * | 9/2006 | Dastidar et al. ............ 714/724 |
| 7,139,955 | B2 * | 11/2006 | Rohrbaugh et al. ......... 714/738 |
| 2004/0153928 | A1 * | 8/2004 | Rohrbaugh et al. ......... 714/738 |
| 2004/0187060 | A1 * | 9/2004 | Rohrbaugh et al. ......... 714/742 |
| 2004/0216081 | A1 * | 10/2004 | Wells et al. ................... 716/18 |

OTHER PUBLICATIONS

Kelly et al., "Defect Tolerant SRAM FPGAs", IEEE International Conference on Computer Design, VLSI in Computers and Processors, Oct. 10, 1994, pp. 479-482.*

Mathur et al., "Timing Driven Placement Reconfiguration for Fault Tolerance and Yield Enhancement in FPGAs", Proceedings of European Design and Test Conference, Mar. 11, 1996, pp. 165-169.*

Feng et al., "Reconfiguration of One-Time Programmable FPGAs with Faulty Logic Resources", International Symposium on Defect and Fault Tolerance in VLSI Systems, Nov. 1999, pp. 368-376.*

Thoori et al., "Techniques and Algorithms for Fault Grading of FPGA Interconnect Test Configurations", IEEE Transactions on Computer-Aided Design of Integrated Circuits and Systems, vol. 23, No. 2, Feb. 2004, pp. 261-272.*

Hanchek et al., "Methodologies for Tolerating Cell and Interconnect Faults in FPGAs", IEEE Transactions on Computers, vol. 47, No. 1, Jan. 1998, pp. 15-33.*

U.S. Appl. No. 10/631,461, filed Jul. 30, 2003, Wells et al.

U.S. Appl. No. 10/199,535, filed Jul. 18, 2002, Trimberger.

U.S. Appl. No. 10/104,324, filed Mar. 22,,2002, Wells et al.

U.S. Appl. No. 10/388,000, filed Mar. 12, 2003, Bapat et al.

Sharp, Steve; "Xilinx Delivers Lower Cost While Continuing to Redefine Programmable Logic," 2002, pp 6-8, available from Xilinx, Inc., 2100 Logic Drive, San Jose, CA 95124.

Baradaran, Mehdi et al; "Improving Detectability of Resistive Open Defects in FPGA," Center for Reliable Computing, available from Stanford University, Stanford CA 94305.

Overton, Rick; "Molecular Electronics Will Change Everything,"Wired.com, Issue 8.07, Jul. 2000, pp 1-12, available from www.wired.com/wired/archive/8.07/moletronics_pr.html.

Chappell Brown; "Researchers Close To Delivering Molecular Circuits," Tektronix, Feb. 12, 2002, pp. 1-4, Available from EETimes @ http://www.eetimes.com/story/OEG20020215S0063.

Nackashi, David P. et al.; "Molectronics: A Circuit Design Perspective," pp. 1-9, Dept. of Electrical and Computer Engineering, North Carolina State University, ECE, Box 7914, NCSU, Raleigh, NC 27695-7914, available from http://www.ece.ncsu.edu/erl/faculty/paulf.html.

Goldstein, Seth Copen et al.; "NanoFabrics: Spatial Computing Using Molecular Electronics," The 28th Annual International Symposium on Computer Architecture, Jun. 2001, pp. 1-12, available from Carnegie Mellon University, School of Computer Science, Pittsburgh PA 15213-3891.

Tahoori, Mehdi B. et al., "Automatic Configuration Generation for FGPA Interconnect Testing," pp. 2-6, availabel from Center for Relaiable Computing, Stanford University, Standford, CA.

Smith, Michael J.S., "Application-Specific Integrated Circuits," Addison-Wesley VLSI Systems Series, 1997, pp. 711-804, available from Addison-Wesley Longman, Inc. http://www.awl.com/cseng.

Xilinx, Inc., "Virtex-II 1.5V Field-Programmable Gate Arrays," Advanced Product Specification, Nov. 29, 2001, pp. 1-39, DS031-2 (v1.9), available from Xilinx, Inc., 2100 Logic Drive, San Jose, CA 95124.

* cited by examiner

APPLICATION-SPECIFIC METHODS FOR TESTING MOLECTRONIC OR NANOSCALE DEVICES

CROSS REFERENCE

Each of the following U.S. patent and U.S. patent applications is hereby incorporated by reference in its entirety: U.S. patent application Ser. No. 10/388,000, now U.S. Pat. No. 7,007,250, entitled "Application-Specific Methods Useful For Testing Lookup Tables in Programmable Logic Devices" by Shekhar Bapat et al., filed on Mar. 12, 2003; U.S. patent application Ser. No. 10/104,324, now U.S. Pat. No. 6,817,006, entitled "Application-Specific Testing Methods for Programmable Logic Devices," by Robert W. Wells et al., filed on Mar. 22, 2002; and U.S. Pat. No. 6,664,808 entitled "A Method of Using Partially Defective Programmable Logic Devices" by Zhi-Min Ling et al., issued on, Dec. 16, 2003.

FIELD OF THE INVENTION

The present invention relates to application-specific methods for testing molectronic or nanoscale integrated-circuit resources.

BACKGROUND

Programmable logic devices (PLDs), such as field-programmable gate arrays (FPGAs), are user-programmable integrated circuits that can be programmed to implement user-defined logic functions. In a typical architecture, an FPGA includes an array of configurable logic blocks (CLBs) surrounded by programmable input/output blocks (IOBs). A hierarchy of programmable routing resources interconnects the CLBs and IOBs. Loading a configuration bitstream into configuration memory cells of the FPGA customizes these CLBs, IOBs, and programmable routing resources. Additional resources, such as multipliers, processors, memory, and application-specific circuits may also be included.

PLDs are growing ever more dense as vendors attempt to satisfy customer demand for PLDs capable of performing ever more complex tasks. Unfortunately, as die size and complexity increase, so too does the probability of finding a defect on a given die. The process yield therefore decreases with PLD complexity, making already expensive PLDs still more expensive. Yield is expected to approach zero as minimum feature sizes approach molecular dimensions.

PLDs are not design specific, but instead afford users (e.g., circuit designers) the ability to instantiate an almost unlimited number of circuit variations. Not knowing in advance the purpose to which a given PLD will be dedicated places a heavy burden on a PLD vendor to ensure the quality and reliability of the PLD because PLD vendors must verify the functionality of every feature that might be used. As a result, PLD manufacturers discard PLDs' that include even relatively minor defects.

PLD defects can be categorized in two general areas: gross defects that render the entire PLD useless or unreliable, and localized defects that damage a relatively small percentage of the PLD. It has been found that, for large die, close to two thirds of the die on a given wafer may be discarded because of localized defects. Considering the costs associated with manufacturing large integrated circuits, discarding a significant percentage of PLD die has very significant adverse economic impact on PLD manufacturers. This problem is expected to worsen with further reductions in feature size and increases in device complexity.

Others have recognized the growing importance of defect-tolerant reconfigurable systems. For example, in U.S. Pat. No. 5,790,771, incorporated herein, Bruce W. Culbertson and Philip J. Kuekes describe methods that facilitate the use of reconfigurable systems that contain one or more defective resource. That reference discusses techniques for locating and documenting defective resources on reconfigurable systems. Circuit designs are then instantiated on the defective reconfigurable system using the recorded defect information to avoid defective resources.

The main difficulty with the aforementioned "locate and avoid" approach to defect tolerance in reconfigurable systems is that the task of locating defects can be daunting. This difficulty is expected to grow more troublesome with increases in device complexity and with the adoption of nanoscale technology, or "nanotechnology" and molecular-scale technology, or "molectronics." In the present disclosure, nanotechnology employs device minimum feature sizes that range from about one to ten nanometers, and molectronic devices employ still smaller minimum feature sizes.

Many of the constituent components of devices formed using molectronics or nanotechnology are chemically assembled in a manner that affords process engineers less control over individual circuit features than is currently available in modern photolithography processes. As a result, the super-high density circuits have a far greater number and proportion of defects. PLDs incorporating molectronic and nanotechnology structures are therefore virtually guaranteed to include a significant number of defective resources. There is therefore a need for defect-tolerant methods of instantiating circuit designs on integrated circuits.

SUMMARY

The present invention enables PLD manufactures to implement selected customer designs on PLDs that include one or more defective resources. Methods in accordance with the various embodiments described below provide defect tolerance as follows:

1. Alternative physical interconnect resources are provided for each net specified by a user design. Defective interconnect resources are then identified and substituted with a non-defective alternative interconnect resource.
2. Test circuitry for verifying the suitability of a given device for a customer design limits testing to those resources required for the customer design. Defects associated with unused resources are inconsequential, and are therefore ignored.
3. Testing of physical resources for use in a customer design is limited to the functionality required by the design. Functions not used in the customer design are ignored.

The above-listed methods, especially in combination, provide significantly improved defect tolerance over conventional methods, facilitating the adoption of high-density configurable resources manufactured using nanotechnology and molectronics. This is important, as such processes produce far more defective resources than is acceptable in modern semiconductor processes. Test methods in accordance with some embodiments are applied to hybrid PLDs (HPLDs) that includes CMOS logic circuits programmably interconnected using molectronic or nanotechnology crossed-wire switches.

This summary does not limit the scope of the invention, which is instead defined by the claims.

DETAILED DESCRIPTION

Figure 1:
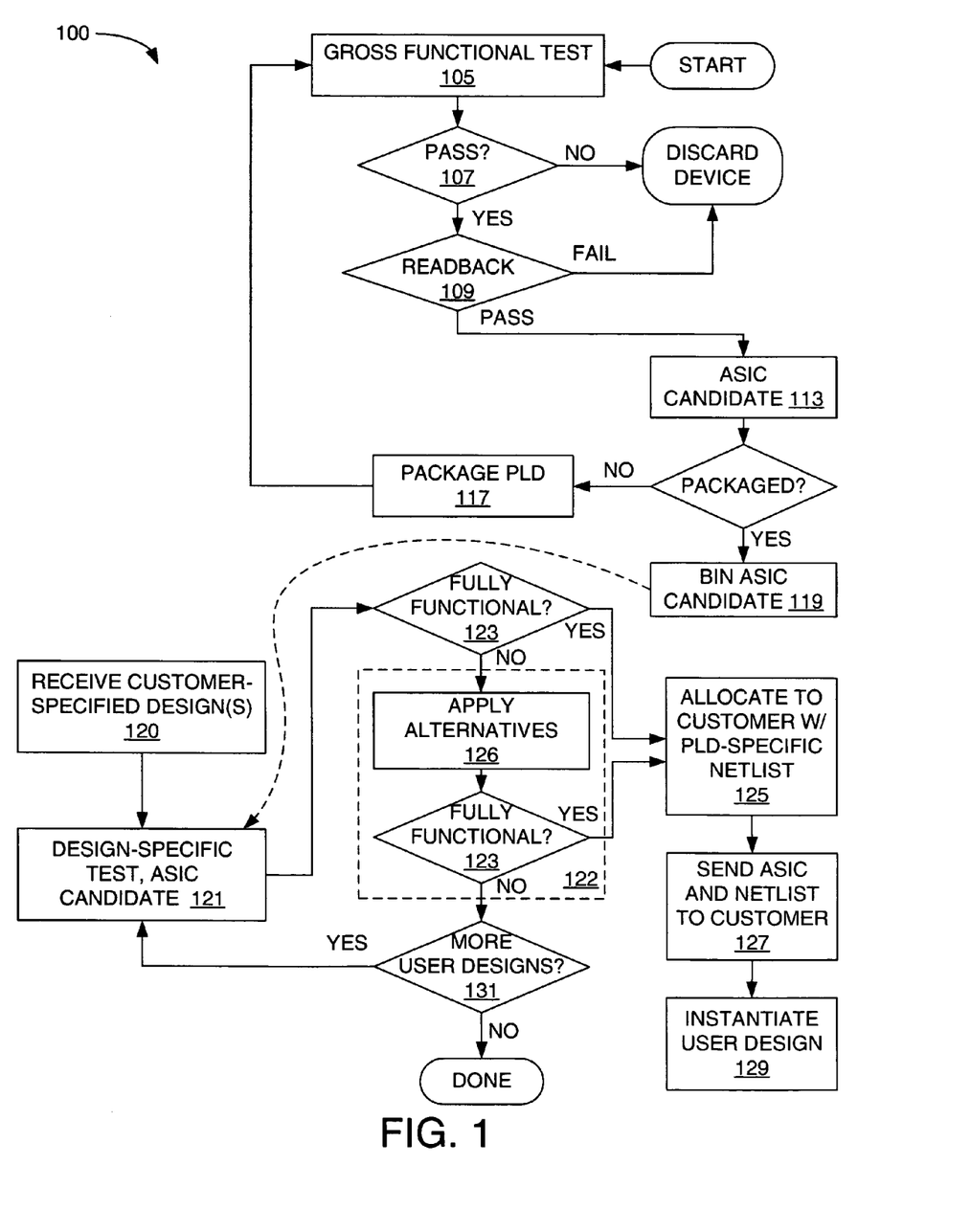
FIG. 1 is a flowchart 100 showing a test method in accordance with one embodiment.

FIG. 1 is a flowchart 100 showing a test method in accordance with one embodiment, as applied to a molectronic or nanotechnology device or to hybrid PLDs (HPLDs) that include CMOS logic circuits programmably interconnected using molectronic or nanotechnology crossed-wire switches. The test method is carried out in software that can be stored on any computer-readable medium. Examples of computer-readable media include magnetic and optical storage media and semiconductor memory. The software and related test hardware is adapted to carry out a test sequence that first sorts HPLDs based on the types and numbers of defects, and then matches HPLDs without excessively problematic types and numbers of defects with customer designs that function despite those defects.

Subsequent to fabrication, the various HPLDs are tested for gross defects (step 105). So-called "gross" defects are defects that render a device unfit for any customer purpose. Examples of gross defects include power-supply shorts or opens, excessive leakage, defective clock-management circuitry, or an excessive proportion of defective resources. In some embodiments, defects associated with input/output blocks (IOBs) are considered gross defects. Devices with gross defects are discarded (decision 107). Many suitable test methods for identifying gross defects are well known to those of skill in the art, some of which are described in chapter 14 of "Application-Specific Integrated Circuits," by Michael John Sebastian Smith (1997), which is incorporated herein by reference.

In embodiments in which the device under test (DUT) includes configuration memory cells, HPLDs that survive decision 107 are subjected to a "readback test" to verify the function of the configuration memory cells (decision 109). In this step, configuration memory is programmed to include various patterns of configuration data and then read back to verify the correct program states of those cells. In one embodiment, HPLDs are rejected if they have a large number or concentration of defects. The number considered "large" will depend upon, in part, the size of the PLD in question and the distribution of the defects, as these parameters determine the likelihood of such defects rendering a PLD useless for instantiating customer designs (also referred to as "user designs"). For example, molectronic or nanotechnology interconnect resources may be expected to include many more defects than CMOS logic circuits. The relatively high number of defects attributable to nanoscale or molectronic circuits can be attributed, in part, to a relatively high number and density of device features. For example, the minimum feature size of the interconnect portion of an HPLD is expected to be less than ten percent the minimum feature size of the logic blocks.

Defects identified thus far are generally not associated with a specific physical resource or location. For example, a signal path deemed defective for failing in a test circuit may include interconnect lines of various lengths extending in different layers and directions, buffers, programmable interconnect points, and vias that interconnect conductors from different layers. A signal's failure to propagate through such a path does not identify the specific physical resource responsible for the failure. Thus, the mere identification of a defect is generally not enough to physically locate the defect.

At decision 109, HPLDs having more than the maximum allowable number or proportion of defects are discarded, and HPLDs having fewer than the maximum allowable number or proportion of defects are identified as "ASIC candidates" (step 113). ASIC candidates are those devices that, though possibly imperfect, may have adequate resources to instantiate some user designs. Other embodiments might separate ASIC candidates based on their likelihood of success at implementing a user design. For example, an HPLD with only one defective input/output resource and less then a certain percentage of interconnect defects might be considered more valuable than a device with five defective input/output resources and a higher proportion of defects in molectronic or nanotechnology portions.

ASIC candidates identified in step 113 are packaged (step 117) and the resulting packaged ASIC candidates are subjected to the same or a similar series of tests as were the post-fabrication HPLDs, beginning once again at step 105 in this example. The tests are run again to ensure excessive defects were not introduced by or during the packaging process and/or to detect any defects that may not have been observable prior to packaging. If a packaged device has a suitably low number or proportion of defects, the process eventually moves to step 119, in which case the packaged HPLD is binned (step 119) according to the HPLD's suitability for various applications. For example, HPLDs may be binned (sorted) based on the locations and numbers of defects. In the next sequence of steps, the binned HPLDs are tested for suitability in implementing one or more specific user designs.

At some time prior to the next step in the illustrated test method, the HPLD manufacturer receives one or more user designs expressed using the appropriate design software (step 120). A single customer can require a passing ASIC candidate be fully functional with more than one circuit design, in which case the designs can be tested separately, or multiple design expressions can be merged into one design expression for use in a single design-specific test. The received design expressions, typically netlists or bitstreams, are stored for later use in performing design-specific tests.

Design expressions of interest are matched with ASIC-candidate HPLDs of the appropriate type (e.g., HPLDs with the size and pin configuration appropriate for the design expressions). A first of these customer design expressions is then analyzed to create design-specific test expressions to instantiate design-specific test circuits on one of the ASIC candidates of step 119. These test expressions include alternative resources for implementing various logic and interconnect functions of the customer design. Test 121, a series of design-specific tests, is detailed below in connection with FIGS. 3–6.

In decision 123, if the ASIC candidate under test is fully functional with the design of interest, the device is identified as acceptable for use with the particular design (step 125). The device is eventually sent to the customer (step 127), who then programs the specific HPLD with the design expression used in step 121 (step 129). Turning to process 122, if the design of interest is not fully functional in the selected device, alternative test expressions are developed and applied (step 126) to determine whether suitable redundant resources on the HPLD can be substituted for defective resources. If such substitution produces a fully functional device (decision 123), the HPLD under test is allocated for use with the customer design from which the test circuits were derived (step 125); otherwise, one or more additional user designs may be tried (decision 131), in which case the test sequence returns to step 121. The process is finished when the HPLD under test is allocated for use with at least one specific user design or the user designs are exhausted. If no suitable design is found the HPLD might be discarded or saved for testing on later received user designs. An HPLD might be discarded after, for example, ten failed attempts to instantiate different user designs.

HPLDs allocated to a selected customer design are labeled accordingly to ensure they are not used in applications that may require defective resources. HPLDs may also be adapted to reject any but the verified user design. For example, a unique signature, such as a cyclic-redundancy-check (CRC) value of the bitstream for the verified design, may be stored in non-volatile memory on an HPLD and used to verify the design. U.S. patent application Ser. No. 10/199,535 entitled "Methods and Circuits for Dedicating a Programmable Logic Device for Use with Specific Designs," by Stephen M. Trimberger, filed on Jul. 18, 2002, describes methods for dedicating a PLD for use with one or more specific user designs, and is incorporated herein by reference.

In conventional testing, many PLDs are rejected due to a small number of random defects. Identifying ones of these that may nevertheless function perfectly with specific user designs allows PLD manufacturers and their customers to benefit from the use of PLDs that would otherwise be wasted. PLD manufactures benefit from significantly improved yield, and PLD customers benefit because PLDs suitable for their particular purpose are available at a lower price. Also advantageous from the user perspective, the recovered PLDs are physically and functionally identical to the fully functional PLDs first used to bring their products to market, so no engineering resources are otherwise required to adapt their product to a new ASIC. The time normally required to adapt a product to a new ASIC is also reduced, allowing customers to move more quickly to a less expensive alternative to fully functional PLDs. The defect insensitivity of the methods in accordance with the embodiments described herein is particularly advantageous in HPLDs or other circuits employing molectronic or nanotechnology circuits, as such devices are presumed to include a substantial number of defective resources. Flowchart 100 is illustrative; in practice, the flow may be quite different, with different steps accomplished in different orders and/or at different times.

Figures 2, 4:
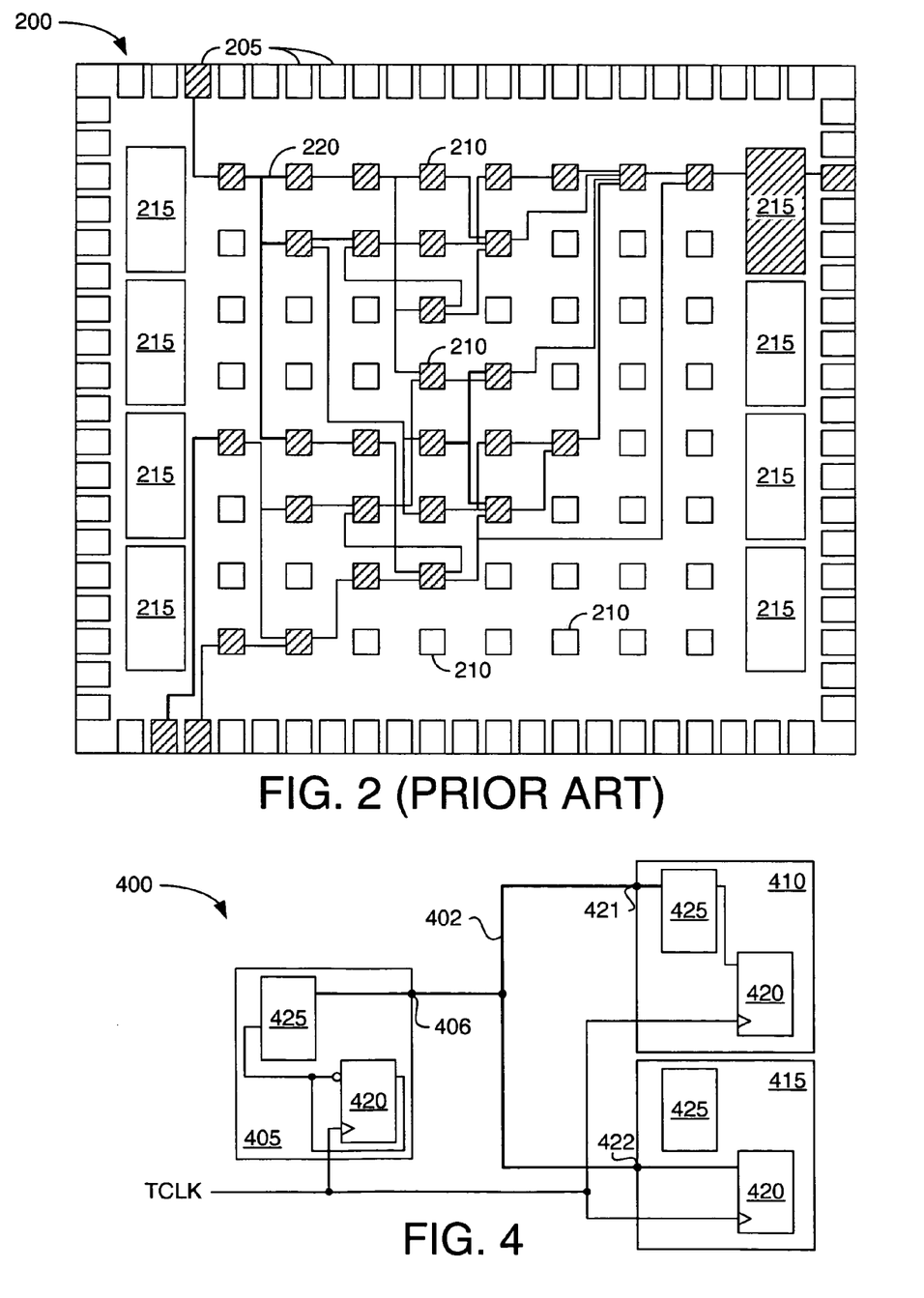
FIG. 2 is a block diagram of a conventional FPGA 200 in which is instantiated an illustrative user design.
FIG. 4 depicts a test circuit 400 that can be generated automatically, in accordance with one embodiment, to test the integrity of a net 402 extracted from a user design.

FIG. 2 is a block diagram of a conventional FPGA 200 in which an illustrative user design is instantiated. FPGA 200 includes a collection of programmable logic, including a plurality of input/output blocks (IOBs) 205, an array of configurable logic blocks (CLBs) 210, and a plurality of RAM blocks 215, all of which may be selectively interconnected via programmable routing resources. In other embodiments, FPGA 200 is an HPLD in which the interconnect resources are molectronic or nanotechnology crossed-wire switches.

CLBs 210 are the primary building blocks and contain elements for implementing customizable gates, flip-flops, and wiring; IOBs 205 provide circuitry for communicating signals with external devices; and RAM blocks 215 allow for synchronous or asynchronous data storage, though each CLB can also implement synchronous or asynchronous RAMs. The programmable routing resources interconnect the various elements, forming a plurality of signal nets 220. For a detailed treatment of an exemplary FPGA architecture, see the Xilinx advance product specification entitled "Virtex-II 1.5V Field-Programmable Gate Arrays," DS031-2 (v1.9), Nov. 29, 2001, which is incorporated herein by reference.

While illustrated with respect to an FPGA architecture, the test procedures discussed herein are equally applicable to other types of PLDs and integrated circuits. In general, high-density PLD architectures include a number of programmable logic elements and some programmable routing resources. Programmable logic elements have many forms and many names, such as CLBs, logic blocks, logic array blocks, macro cells, logic cells, functional blocks. Programmable routing resources also have many forms and many names. Embodiments of the invention simplify design-specific testing by separately testing the logic elements and interconnect resources required for a given design.

Figure 3:
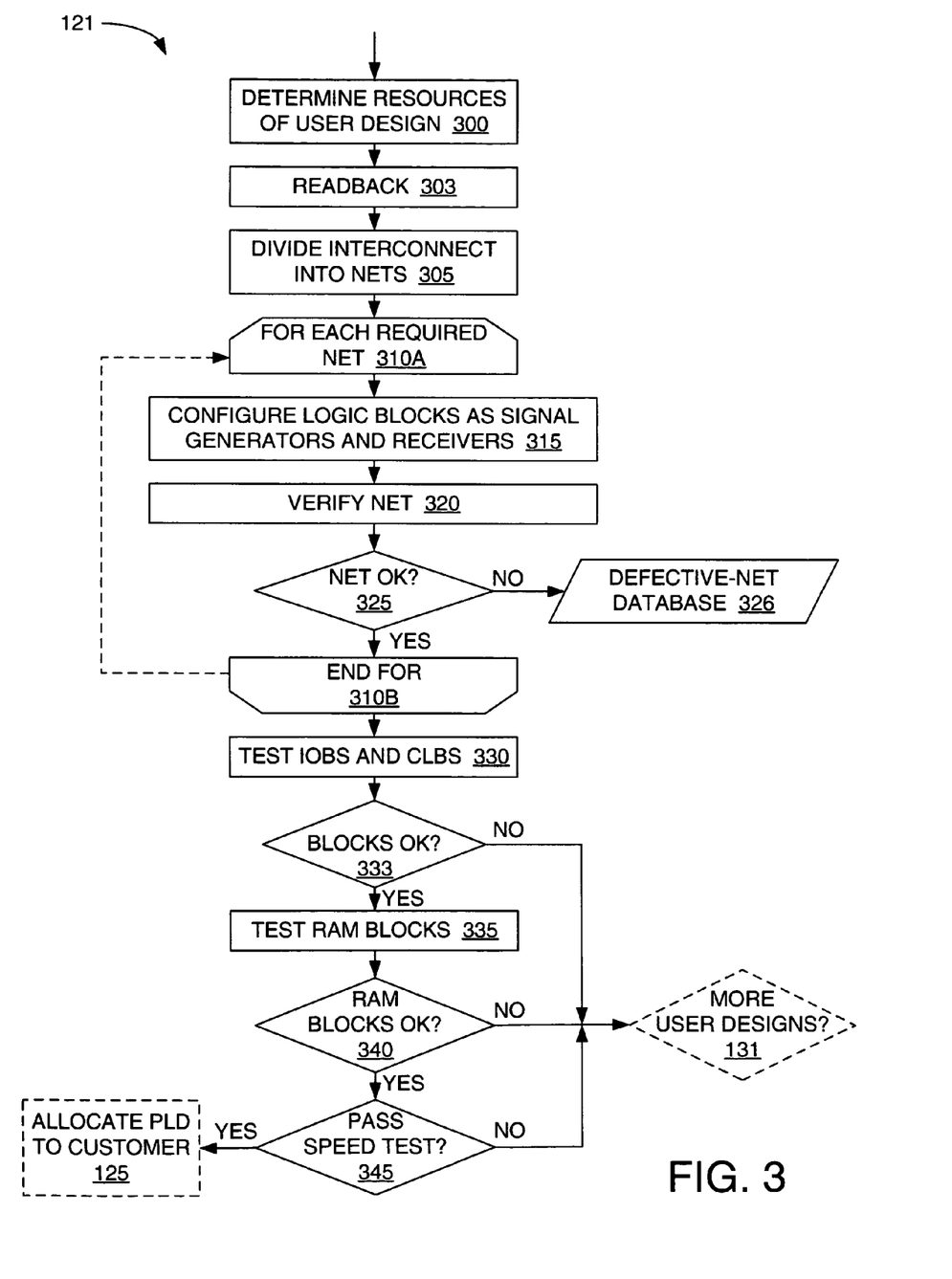
FIG. 3 is a flowchart detailing a portion of the design-specific test step 121 of FIG. 1.

FIG. 3 is a flowchart detailing a portion of the design-specific test step 121 of FIG. 1. Part of the test sequence of FIG. 3 is detailed in U.S. patent application Ser. No. 10/104,324 entitled "Application-Specific Testing Methods for Programmable Logic Devices," by Robert W. Wells et al., which has been incorporated herein by reference. The present application describes novel methods for testing configurable logic blocks and interconnect resources, so the following discussion focuses on those portions of the test flow of FIG. 3.

To begin with, software analyzes the user design to identify the resources required for the design (step 300). Such resources are depicted in the example of FIG. 2 as the shaded IOBs 205 and CLBs 210, a shaded RAM block 215, and nets 220 used to interconnect them (the remaining interconnect resources are omitted here for clarity). A given user design might additionally include carry logic, registers, sum-of-products logic, tri-state buffers, microprocessors, and clock-management circuitry, to name just a few possibilities. Also included but not shown are the programmable memory cells that define the user configuration. The depicted configuration is a simple logic circuit intended only for illustration; practical logic circuits in conventional FPGAs are typically far more complex.

Test methodologies are prepared for each required resource identified in step 300. Some of the test methodologies are conventional, such as those used to test block RAM. Other methodologies, detailed below, allow test engineers to forego the complex and expensive task of developing design-specific tests. These methodologies specifically address interconnect resources and logic-block (e.g., CLB) functionality.

Design-Specific Test Configurations: Interconnect Resources

The test software of step 305 divides the interconnect resources specified in the user design into the required set of nets 220. As used herein, a "net" is a subset of the programmable interconnect resources programmed to extend between source and destination nodes. A number of sample nets are depicted in FIG. 2 using bold lines. In general, each net includes one signal source and one or more signal destination. The collection of nets together includes all signal paths defined by the user design, and the nets used for test are selected to minimize overlap.

FIG. 4 depicts a test circuit 400 that can be generated automatically, in accordance with one embodiment, to test the integrity of a net 402 extracted from a user design. A signal source 405 and destination circuits 410 and 415 are substituted for the logic that is specific to the user design from which net 402 was extracted. Source 405 and circuits 410 and 415 are CLBs in the example, but each element might also be, e.g., an IOB or a RAM block. In the example, source 405 is configured as a general-purpose test-signal generator that produces a sequence of ones and zeros on a source node 406 in response to a test clock TCLK. Source 405 includes a flip-flop 420 connected through a look-up table (LUT) 425 to net 402. Source 405 need not include LUT 425, but this example assumes the portion of net 402 within the CLB used to instantiate source 405 is a portion of the user design. If the interconnect in the user design instead extended directly from flip-flop 420, then the preferred simulated net would similarly extend directly from flip-flop 420.

Destination circuits 410 and 415 are general-purpose test-signal observers. Each includes a respective LUT 425 and flip-flop 420. Flip-flops 420 are adapted to store signals presented to destination nodes 421 and 422 over net 402. To test net 402 on a device of interest, test circuit 400 is first instantiated on the device. Signals from source 405 are then clocked across net 402 into destination circuits 410 and 415 using test clock TCLK. The resulting contents of the flip-flops 420 in destination circuits 410 and 415 are then read back to ensure net 402 passed the correct data. The portions of net 402 that extend within destinations 410 and 415 are preferably the same portions employed by the user design. In the example, the user design includes local routing within destination 410 that conveys a signal to the respective LUT 425 and local routing within destination 415 that conveys a signal to the respective flip-flop 420.

The programming process used to generate the configuration data defining the various test circuits, including the test-signal generators and observers, typically utilizes design entry software (e.g., synthesis or schematic tools), place-and-route software, and bitstream generation software executed on a personal computer or workstation. The software includes a library of pre-defined circuit "macros" that define the test-signal generator and observer logic functions for each type of programmable block in a given PLD type. The use of "macros" in PLD programming processes is well known.

Programmable blocks (e.g., IOBs, CLBs, and RAM) typically include memory elements and local routing. In verifying the routing path between programmable blocks in a given customer design, it is preferred that the local routing within the blocks be the same local routing used in the customer design. Consequently, the macros used to instantiate test-signal generators and receivers include, where possible, internal routing identical to their counterparts in the customer design.

In one embodiment, a library of software macros includes, for each type of logic block, a set of signal generators and observers that includes every possible configuration of local interconnect resources. Providing a test circuit for a net in a customer design then includes selecting test-signal generator and observer library elements whose local interconnect configurations best match the corresponding logic-block configurations in the customer design.

Some programmable resources may be difficult to test using the types of signal generators and observers described above. It may be difficult, for example, to create a toggle flip-flop that includes the carry chain resources available in some CLBs. In such cases, the logic block that cannot be effectively modeled as a signal generator and/or signal observer is instead instantiated between two other logic blocks, one of which is configured as a test-signal generator, the other of which is configured as a test-signal observer. In this instance, the intermediate logic block becomes a portion of the net connecting two other logic blocks.

Design-Specific Test Configurations: Logic Blocks

The test software also develops test methodologies for the various CLBs 210 employed in the user design (e.g., the shaded CLBs 210 of FIG. 2). The design expression of interest is analyzed to determine what logical operation is to be provided by each CLB in the customer design. PLD design software then generates a design-specific expression of a test circuit to be instantiated on the PLD under test to verify the logical operations performed within each CLB in the design of interest.

Figure 5:
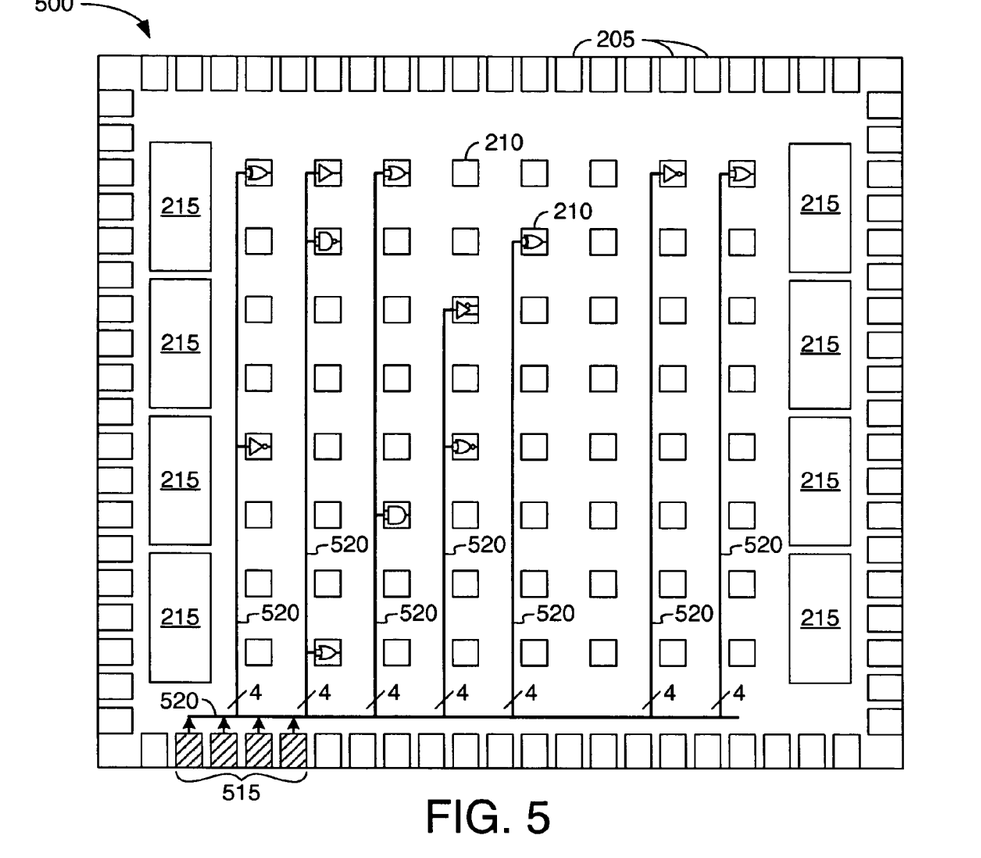
FIG. 5 depicts an FPGA 500 configured to include a test circuit that can be generated automatically, in accordance with one embodiment, to test the suitability of potentially defective CLBs for use in a design of interest.

FIG. 5 depicts an FPGA 500 configured to include a test circuit that can be generated automatically, in accordance with one embodiment, to test the suitability of potentially defective CLBs for use in a design of interest. FPGA 500 is identical to FPGA 200 of FIG. 2, like-named elements being the same.

FPGA 500 illustrates a configuration in which each CLB 210 employed in the design of interest (the same illustrative design discussed in connection with FIG. 2) is programmed to perform the logical operation required in that design. The CLBs 210 of FPGA 500 are the same ones depicted in FIG. 2 as including randomly selected logic-gate symbols. The test configuration differs from that of the customer design in that nets 220 are eliminated; instead, the CLBs of the customer design are connected in parallel to four I/O pins 515 via a common bus 520. The test expression derived from the expression of the user design defines the depicted configuration.

To test the CLBs required for the user design, the configuration of FPGA 500 is instantiated on a device being tested for suitability with the user design. In a device so configured, pins 515 connect bus 520 to a signal generator (not shown) capable of producing every possible combination of input signals for each CLB. The four-line example assumes, for simplicity, that each CLB is capable of providing logic functions of up to four binary input signals; however, conventional logic blocks can logically combine more or fewer input signals.

Figure 6:
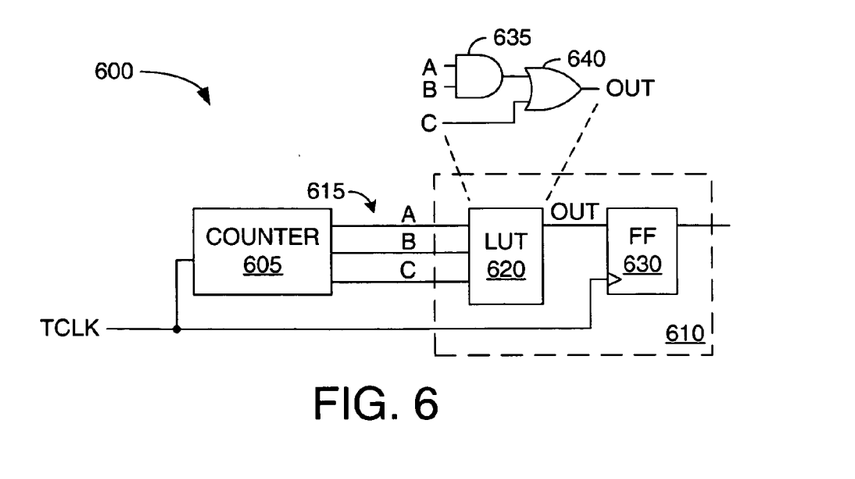
FIG. 6 depicts a simplified, single-CLB example of a test configuration 600 of the type shown in FIG. 5.

FIG. 6 depicts a simplified, single-CLB example of a test configuration 600 of the type shown in FIG. 5. Configuration 600 includes a counter 605 connected to a CLB 610 via a three-line bus 615. CLB 610 conventionally includes a look-up table (LUT) 620 and an output flip-flop 630. Conventional CLBs include many additional resources that have been omitted here for brevity. Some such resources are discussed below in connection with FIG. 7.

LUT 620, capable of providing any logic function of up to three input signals, is configured to perform a random function illustrated as a pair of interconnected gates 635 and 640 (a three-input example is used here for simplicity). As is well known, logic functions can be specified using "truth tables." The truth table for the combination of gates 635 and 640, and consequently for LUT 620 when configured to instantiate the logic function of gates 635 and 640, is provided below in Truth Table 1.

TRUTH TABLE 1

| COUNT (A, B, C) | OUT |
| --- | --- |
| 0 0 0 | 0 |
| 0 0 1 | 1 |
| 0 1 0 | 0 |
| 0 1 1 | 1 |
| 1 0 0 | 0 |
| 1 0 1 | 1 |
| 1 1 0 | 1 |
| 1 1 1 | 1 |

The foregoing truth table is easily extracted from a PLD design expression that specifies a LUT programmed to perform the logical operation symbolized using gates 635 and 640. Truth tables expressing the logical operation of each CLB in a given design can similarly be extracted. One design-specific test in accordance with an embodiment of the invention takes advantage of such extracted data to verify the logical function provided by each CLB. In the example of FIG. 6, counter 605 steps through each of the $2^3$ (eight) possible combinations of input signals to LUT 620 and, for each count, verifies that LUT 620 provides the appropriate output signal. In other words, counter 605 provides the counts depicted in truth table 1, above, and verifies each of the corresponding eight output signals.

System 600 employs flip-flop 630 to store the output of LUT 620 for each count, though this is not necessarily required. For CLBs that use flip-flop 630 in the desired customer design, incorporating flip-flop 630 provides a more exhaustive test. Flip-flop 630 may also be used to advantage in CLBs that do not require a flip-flop in the customer design of interest because flip-flop 630 provides a convenient means of storing and reading LUT output signals. Many logic elements (e.g., each configured CLB 210 of FIG. 5) can be tested in parallel to reduce test time.

The tests described above focus the inquiry on the resources required by the customer design of interest, and so do not often reject devices based on failing resources that are not relevant to a customer design. It does not matter, for example, whether LUT 620 produces the correct output levels when programmed to perform logic functions other than that required by the design of interest.

The test methods and circuits described above provide excellent fault coverage while allowing test engineers to forego the complex and expensive task of developing design-specific tests. These methods and circuits also narrow test scope to those resources required for a given design, and consequently reduce the time required for test and increase the number of saleable PLDs. Finally, using test circuits other than the user design to test the resources required for the user design facilitates comprehensive testing without requiring an understanding of the user design.

Design-Specific Test Configurations: Other Resources

Many methods for testing IC resources, including those of PLDs, are well known to those of skill in the art. Any of these methods may be used in accordance with embodiments of the invention to test the remaining resources. The aforementioned methods for testing nets and logic blocks are preferred in some cases, however, as they advantageously reduce the time required to verify the suitability of nets and CLBs for use with specific designs.

Returning to FIG. 3 and having developed the collection of design-specific tests described in connection with FIGS. 4, 5, and 6, the configuration bits required for the user design are written to and read from to verify those resources in the ASIC candidate (step 303). Recall from the discussion of FIG. 1 that ASIC candidates may have a few defective configuration-memory bits: step 303 ensures that any such defective bits do not impact the specific user design.

Next, steps 315 and 320 are repeated for each required net using test configurations of the type described in connection with FIG. 4. The source element of a given net is first configured as a signal generator and the destination element (or elements) is configured as a signal observer (step 315). The selected signal generator then provides signals to the respective destination circuit over the net to confirm the functionality of the net (step 320). Steps 315 and 320 repeat for each net of the user design. If a bad net is identified in decision 325, the identity of the bad net is recorded in a defective-net database (output 326). Once each net is tested, the test moves to step 330 to test the IOBs and CLBs specific to the user design. Collections of nets can be tested in parallel, where possible, to save time.

Some embodiments of the invention perform further testing of the nets to locate shorts between interconnect resources that might impact a customer design. In one embodiment, for example, each net is tested with neighboring interconnect resources held high (e.g., to a logic one). A short between the net under test and a neighboring interconnect line will corrupt the data transmitted over the net. The test can be repeated with neighboring resources held to a logic zero. Such testing can be accomplished using design-specific test circuits defined during step 300 for a particular user design.

Dividing the interconnect into a collection of nets is only one way to test the interconnect resources associated with a given design. For other methods of testing interconnect resources, see, e.g., U.S. Pat. No. 6,651,238 entitled "Providing Fault Coverage of Interconnect in an FPGA," by Robert W. Wells et al., issued on Nov. 18, 2003, which is incorporated herein by reference.

Returning again to FIG. 3, step 330 applies the test configurations discussed above in connection with FIGS. 4 and 5 to test the IOBs and CLBs. In the example of FIG. 5, each CLB 210 under test is configured to perform the requisite user logic and connected to a counter (not shown) via bus 520 and I/O pins 515. The counter then steps through each of the $2^4$ (sixteen) possible input combinations. A readback operation is performed on FPGA 500 after each count to determine whether the appropriate value is stored within the various flip-flops (such as flip-flop 630 of FIG. 6)

in the CLBs under test. If each CLB produces the required output signal for each combination of test signals, then the CLBs meet the logic requirements of the customer design. The test procedure is hastened by testing as many CLBs in parallel as possible. Additional conventional tests can be performed on the IOBs and CLBs to enhance the coverage of the above-identified procedures.

If one or more CLBs or IOBs fails (decision 333), the ASIC candidate is rejected for use with the design used to develop the test configurations; otherwise, the next step 335 tests the RAM blocks. In some FPGAs, CLBs can be configured as RAM. In such cases, any CLBs of the customer design that will be used as RAM are treated to the same types of tests that the RAM blocks are subjected to. Any of a number of well-known RAM testing strategies may be used in step 335.

Should any of the RAM fail, the test rejects the ASIC candidate for use with the present user design; if all the RAM passes, the ASIC candidate may be subjected to one or more parametric tests that verify the speed performance for signals traversing critical paths in the user circuit of interest. For discussions of methods of performance testing PLDs, see U.S. Pat. Nos. 6,075,418 and 6,232,845, both to Kingsley, et al., and the above-incorporated Smith reference. Both Kingsley et al. patents are incorporated herein by reference.

Using the test procedures outlined in the Kingsley et al. patents, collections of configurable resources are configured in a loop so that they together form a free-running ring oscillator. The oscillator produces an oscillating test signal in which the period is proportional to the speed of the components in the loop. Many such oscillators can be instantiated on a given PLD to measure speed performance. In some embodiments, ASIC candidates can be tested using the methods and circuits described in the above-noted patents to Kingsley et al. The resources used in the customer design can be tested for speed, or more exhaustive speed testing can be done before or after design-specific testing. In one embodiment, oscillators of the types described by Kingsley et al. are distributed across the PLD to test for speed. Some oscillators may not function at all due to the defects present in ASIC candidates. These oscillators are, in some embodiments, simply disregarded: the other tests outlined above ensure the defects do not impact customer designs.

If the PLD fails the speed test (decision 345), then the test rejects the PLD for use with the present user design and attempts another user design, if any. Otherwise, if the PLD passes all tests, the ASIC candidate is deemed fit for use with the user's design, and is consequently allocated for sale to the appropriate customer (step 125).

In addition to the tests described above, ASIC candidates can be subjected to the same types of physical and reliability testing as other integrated circuits. Holding defective parts to high standards for specific customer designs may be important for encouraging customers to use the type of ASIC candidates identified using the above methods.

Figure 7:
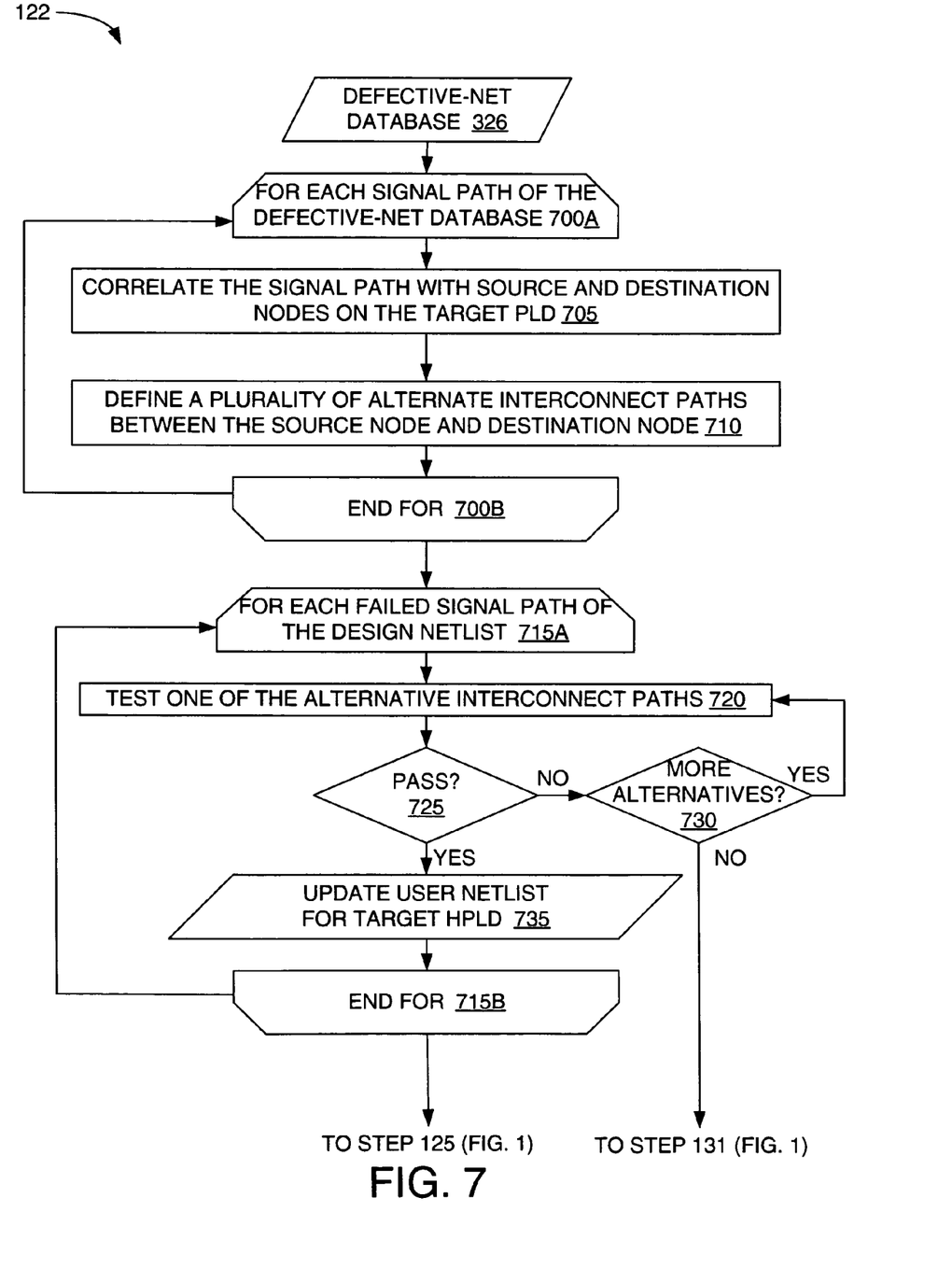
FIG. 7 is a flowchart depicting process 122 (FIG. 1) in accordance with one embodiment.

FIG. 7 is a flowchart depicting process 122 (FIG. 1) in accordance with one embodiment. Recalling from the above discussion of FIG. 1, process 122 develops and applies alternative test expressions to determine whether suitable redundant resources on an HPLD under test can be substituted for defective resources.

Figure 8A:
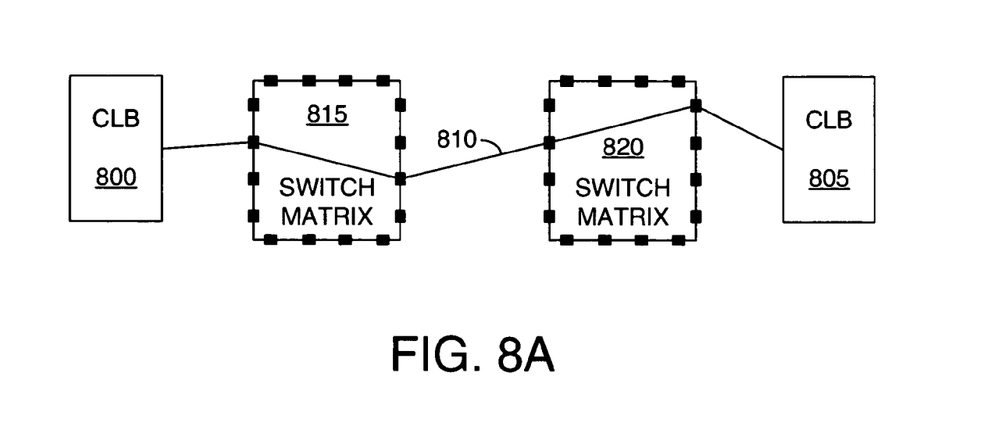
FIG. 8A depicts a pair of switch CLBs 800 and 805 interconnected by a signal path (net) 810 defined in part by a pair of switch matrices 815 and 820.
Figure 8B:
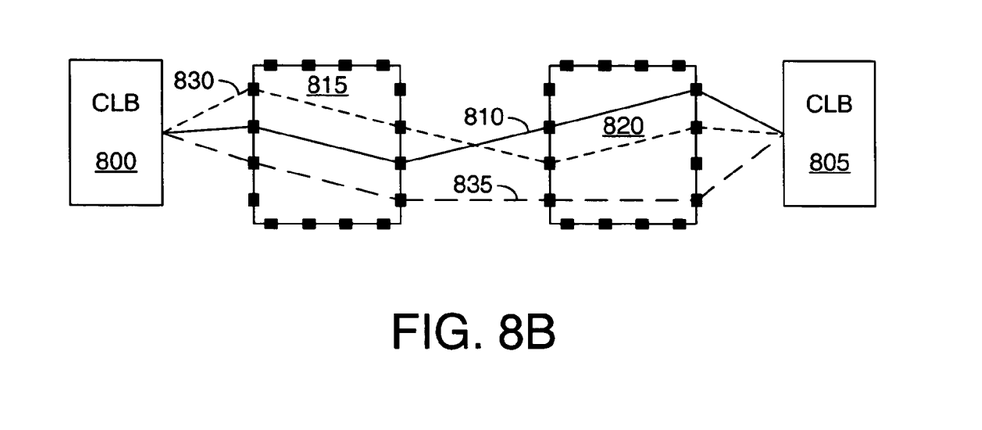
FIG. 8B depicts a pair of alternate signal paths 830 and 835 interconnecting the same two CLBs 800 and 805 of FIG. 8A via different collections of interconnect resources.

Process 122 begins with defective-net database 326 of FIG. 3, which includes a list of defective nets, that is a list of nets required by the customer-specific design that failed in the HPLD under test. For each defective net (loop 700A–700B), the test procedure correlates the failed signal path with physical source and destination nodes on the HPLD under test (step 705) and then defines a number of alternate interconnect paths between those nodes (step 710). These steps are graphically depicted in FIGS. 8A and 8B. In FIG. 8A, a pair of switch CLBs 800 and 805 are interconnected by a signal path (net) 810 defined in part by a pair a switch matrices 815 and 820. In FIG. 8B, a pair of alternate signal paths 830 and 835 interconnect the same two CLBs 800 and 805 via different collections of interconnect resources. While only two alternate signal paths are shown, more or fewer might also be defined.

Once a list of alternatives is defined for each defective net, process 122 moves to the for-loop defined between steps 715A and 715B. The HPLD is configured to instantiate each failed signal path using one of the alternative paths and the HPLD is retested (step 720). Per decision 725, if the alternative interconnect path passes the test, the netlist describing the user circuit for the HPLD under test is updated with the alternative interconnect path (output 735); if the alternative interconnect path fails and there are more alternative paths, then the next alternative path is tried. In the absence of additional alternatives, the process flow moves on to step 131 of FIG. 1. If the process produces a working alternative for each defective net, the process flow moves to step 125 of FIG. 1.

FIG. 7 tries alternative interconnect resources because more defects are expected in the interconnect resources of HPLDs. Other embodiments can employ similar test methods that employ alternatives for other types of resources, such as CLBs, IOBs, and memory blocks.

The trend for modern devices is toward ever greater complexity. Circuit designers therefore create complex systems by integrating proven "core" designs with application-specific circuitry. Typical core designs include processors and memory, but the examples are myriad. As a consequence of this design process, complex circuit designs can often include proven and unproven portions. PLD sales benefit from this circumstance, as it is undesirable to commit to an ASIC while a circuit design includes unproven resources. It may also be undesirable to commit to an ASIC when some portion of the circuit design is subject to changes or upgrades. For example, a circuit design may include communications circuitry that supports an evolving protocol. This too favors PLDs over ASICS.

Figure 9:
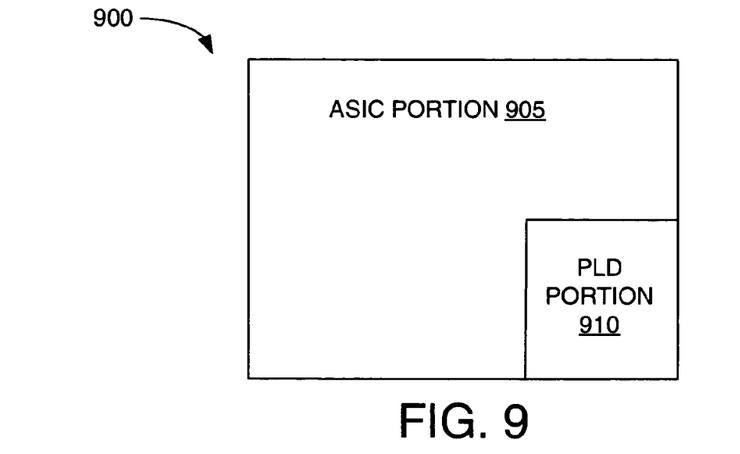
FIG. 9 depicts a PLD 900 that includes an ASIC portion 905 and a PLD portion 910.

FIG. 9 depicts a PLD 900 that includes an ASIC portion 905 and a PLD portion 910. PLD 900 is assumed to include defective resources, and is tested using the above-described methods to identify one or more customer designs that function despite the defects. In accordance with another embodiment, however, a number of PLD resources within PLD portion 910 that are not used in the customer design are nevertheless verified for functionality. The presence of these resources affords the circuit designer the option of altering the user circuitry instantiated within portion 910.

Returning to the example of FIG. 1, a list of required or desired auxiliary resources may be provided along with the customer design in step 120. The process of verifying ASIC functionality and the presence of the requisite auxiliary resources can then be carried out as indicated in flowchart 100. PLD 900 would pass such a test procedure in spite of a failing auxiliary resource if an acceptable alternative auxiliary resource were discovered during process 122.

Figure 10:
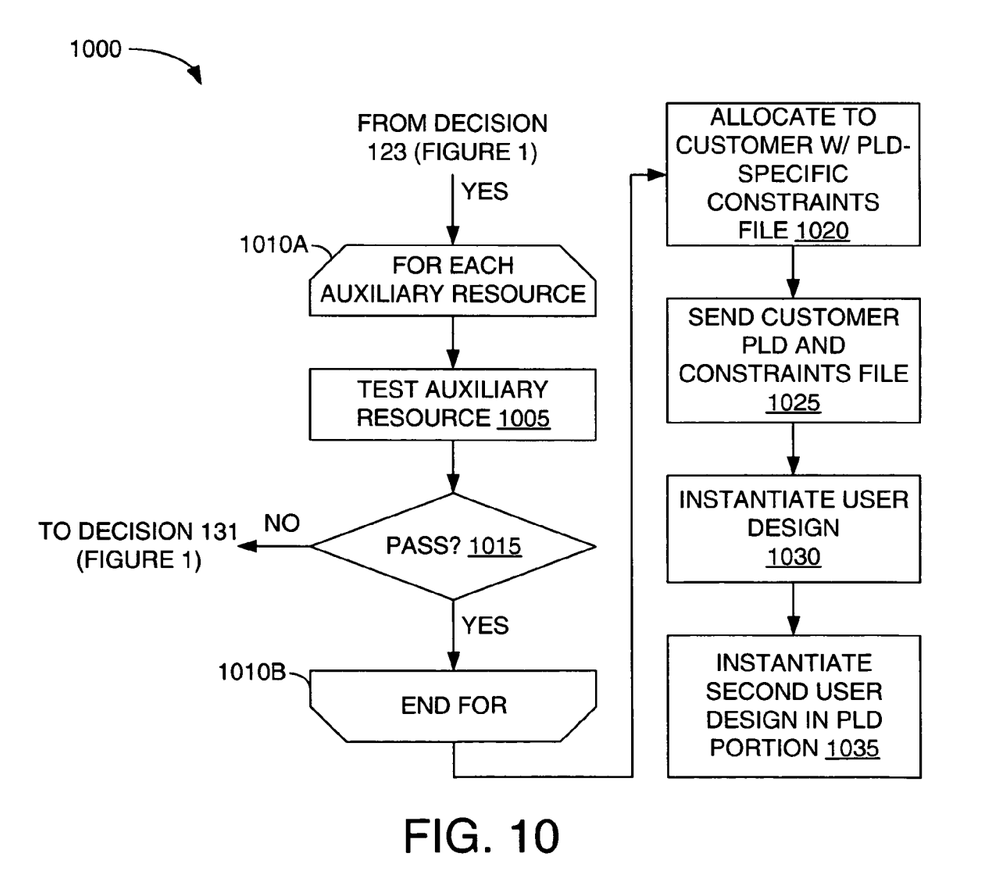
FIG. 10 is a flowchart 1000 describing a subtest for identifying auxiliary resources that support reprogrammability for a portion of an ASIC candidate.

FIG. 10 is a flowchart 1000 that depicts an embodiment of a subtest for identifying auxiliary resources that support reprogrammability for a portion of an ASIC candidate. Flowchart 1000 replaces steps 125, 127, and 129 of FIG. 1.

PLD 900 is tested in the manner described above in connection with FIG. 1 to identify one or more user designs that are fully functional on PLD 900 despite the presence of defective resources. Once PLD 900 is found to be fully functional for a design of interest (decision 123 of FIG. 1), auxiliary resources within PLD portion 910 are tested to ensure some degree of reprogrammability for resources within PLD portion 910. PLD portion 910 is depicted as a separate area on PLD 900, but other embodiments may include more than one PLD portion or the PLD portions can be distributed on the PLD.

The test sequence first defines a number of auxiliary resources within PLD portion 910 that should be tested to ensure adequate flexibility for instantiating design changes. The extent of the available auxiliary resources can range from a small number of alternative logic or routing resources to defect-free resources within portion 910. For example, the LUTs used to instantiate some user logic can be tested for full functionality, as opposed to the narrower testing described above that is limited to the logic defined in the user design. In other embodiments the auxiliary resources might instead or additionally include specific types of resources that might be used to address common problems or requirements, such as clock inverters to address synchronous elements unintentionally clocked on the wrong edge, optional registers to be included to address unexpected timing errors, or input and output resources. In still other embodiments, the auxiliary resources might be selected based on a perceived need, such as for a known or expected upgrade to the circuitry within portion 910. In general, the more auxiliary resources provided, the more expensive the PLD.

The test flow of flowchart 1000 tests each auxiliary resource (step 1005 of loop 1010A–1010B). While depicted as a "for-loop" for ease of illustration, the test flow might test numerous auxiliary resources in parallel. If any of the required auxiliary resources fail (decision 1015), the flow passes to decision 131 of FIG. 1. If all the required auxiliary resources pass, the PLD under test is allocated for use with the specific customer design. A listing of the verified auxiliary resources is made available to the customer in a PLD-specific constraints file (step 1020).

In some embodiments, the loop 1010A–1010B does not reject the PLD under test if just one or an acceptable percentage of the tested auxiliary resources fails. In some embodiments, some of the auxiliary resources might be deemed more important than others, so the auxiliary-resources test might be altered to required different levels of tolerance for different types of auxiliary resources. For example, all the logic resources within PLD portion 910 might have to pass, but only a percentage of some rarely used routing resources might have to pass.

PLD portion 910 might be instantiated in a more robust technology than ASIC portion 905, e.g., using larger minimum feature sizes.

From step 1020, the tested PLD is sent to the customer that supplied the design used in the test along with the constraints file listing the tested auxiliary resources within portion 910 (step 1025). The customer can then instantiate the circuit design for which PLD 900 was tested (step 1030). Later, if desired, the customer can take advantage of the tested auxiliary resources to instantiate a second user design (step 1035) in PLD portion 910.

While the present invention has been described in connection with specific embodiments, variations of these embodiments will be obvious to those of ordinary skill in the art. For example, the foregoing test describes just a few ways to test programmable resources and circuits instantiated in programmable resources; many other test methods might also be used. Those of skill in testing PLDs can adapt many standard tests for use with the invention. Moreover, different types of PLDs include different types of logic elements and interconnect resources, but can nevertheless benefit from the above-described test methods. Therefore, the spirit and scope of the appended claims should not be limited to the foregoing description.

What is claimed is:

1. A method of testing a programmable logic device to determine whether the programmable logic device is functional when configured to instantiate a circuit design expressed in a design database, wherein the programmable logic device includes a plurality of logic blocks and programmable interconnect resources, the method comprising:
   identifying a collection of signal paths defined in the design database, each signal path including a source node and a destination node;
   instantiating the signal paths on the programmable logic device;
   testing the instantiated signal paths to identify a failed signal path;
   correlating the failed signal path with at least one alternative signal path extending between the source and destination nodes of the failed signal path;
   instantiating the alternative signal path on the programmable logic device;
   testing the instantiated alternative signal path; and
   wherein the testing of one or more of the instantiated signal paths and instantiated alternative signal path includes, configuring one of the logic blocks as a test-signal generator, issuing a test signal from the configured logic block, and transmitting the test signal through the signal path.

2. The method of claim 1, wherein testing of one or more of the instantiated signal paths and the instantiated alternative signal path further includes configuring a second of the logic blocks as a test-signal observer, the test-signal observer receiving the test signal from the test-signal generator via the signal path.

3. The method of claim 2, wherein configuring one of the logic blocks as a test-signal generator includes selecting a test-signal generator from a library based on a match of a logic block configuration in the circuit design with the local interconnect configurations of a set of test-signal generators, wherein the library includes for each type of logic block, a set of signal generators each including a different configuration of local interconnect resources.

4. The method of claim 3, wherein configuring a second of the logic blocks as a test-signal observer includes selecting a test-signal observer from a library based on a match of a logic block configuration in the circuit design with the local interconnect configurations of a set of test-signal observers, wherein the library includes for each type of logic block, a set of signal observers each including a different configuration of local interconnect resources.

5. The method of claim 1, wherein the logic blocks are programmable.

6. The method of claim 1, further comprising:
   identifying a set of logical functions specified in the design database; and
   correlating each of the logical functions with a plurality of alternate ones of the logic blocks capable of performing the logical function.

7. The method of claim 6, further comprising, for each logical function:
   programming one of the plurality of alternate ones of the logic blocks to perform the logical function;
   testing the programmed one of the plurality of alternate ones of the logic blocks to identify a failed logic block;
   programming a second of the plurality of alternate ones of the logic blocks to perform the logical function; and
   testing the programmed second of the plurality of alternate ones of the logic blocks to verify performance of the logical function.

8. A method of testing a programmable logic device to determine whether the programmable logic device is functional when configured to instantiate a circuit design expressed in a design database, wherein the programmable logic device includes a plurality of logic blocks and programmable interconnect resources, the interconnect resources having a minimum feature size of at most ten nanometers, the method comprising:
   identifying a collection of signal paths defined in the design database, each signal path including a source node and a destination node;
   instantiating the signal paths on the programmable logic device;
   testing the instantiated signal paths to identify a failed signal path;
   correlating the failed signal path with at least one alternative signal path extending between the source and destination nodes;
   instantiating the alternative signal path on the programmable logic device;
   testing the instantiated alternative signal path; and
   wherein the testing of one or more of the instantiated signal paths and instantiated alternative signal path includes, configuring one of the logic blocks as a test-signal generator, issuing a test signal from the configured logic block, and transmitting the test signal through the signal path.

9. The method of claim 8, wherein testing of one or more of the instantiated signal paths and the instantiated alternative signal path further includes configuring a second of the logic blocks as a test-signal observer, the test-signal observer receiving the test signal from the test-signal generator via the instantiated alternative signal path.

10. The method of claim 8, wherein the logic blocks have a second minimum feature size greater than the first-mentioned minimum feature size.

11. The method of claim 10, wherein the first-mentioned minimum feature size is less than 10% of the second minimum feature size.

12. The method of claim 8, further comprising:
   identifying a set of logical functions specified in the design database; and
   correlating each of the identified logical functions with a plurality of alternate ones of the logic blocks capable of performing the logical function.

13. The method of claim 12, further comprising, for each logical function:
   programming one of the plurality of alternate ones of the logic blocks to perform the logical function;
   testing the programmed one of the plurality of alternate ones of the logic blocks to identify a failed logic block;
   programming a second of the plurality of alternate ones of the logic blocks to perform the logical function; and
   testing the programmed second of the plurality of alternate ones of the logic blocks to verify performance of the logical function.

14. The method of claim 8, further comprising specifying a plurality of auxiliary resources unlisted in the design database.

15. The method of claim 14, further comprising testing the auxiliary resources.

16. The method of claim 15, wherein testing the auxiliary resources identifies passing auxiliary resources, the method further comprising sending a customer the programmable logic device and a list of the passing auxiliary resources.

17. The method of claim 15, further comprising rejecting the programmable logic device for use with the circuit design based upon a failure of at least one of the plurality of auxiliary resources.

* * * * *